US007961541B2

(12) United States Patent
Chan-Choi et al.

(10) Patent No.: US 7,961,541 B2
(45) Date of Patent: Jun. 14, 2011

(54) MEMORY DEVICE WITH SELF-REFRESH OPERATIONS

(75) Inventors: Myung Chan-Choi, San Jose, CA (US); Seung-Moon Yoo, Cupertino, CA (US); Arthur Kwon, San Jose, CA (US)

(73) Assignee: ZMOS Technology, Inc., Cupertino, CA (US)

( * ) Notice: Subject to any disclaimer, the term of this patent is extended or adjusted under 35 U.S.C. 154(b) by 43 days.

(21) Appl. No.: 12/332,740

(22) Filed: Dec. 11, 2008

(65) Prior Publication Data

US 2009/0154278 A1    Jun. 18, 2009

Related U.S. Application Data

(60) Provisional application No. 61/013,081, filed on Dec. 12, 2007.

(51) Int. Cl.
*G11C 7/00* (2006.01)

(52) U.S. Cl. ... 365/222; 365/227; 365/228; 365/230.06; 365/233.5; 365/236

(58) Field of Classification Search ............ 365/222, 365/227, 228, 230.06, 233.5, 236
See application file for complete search history.

(56) References Cited

U.S. PATENT DOCUMENTS

| | | | |
|---|---|---|---|
| 5,959,924 A | 9/1999 | Son et al. | |
| 6,038,186 A | 3/2000 | Tanizaki | |
| 6,219,292 B1 | 4/2001 | Jang | |
| 6,288,967 B2 | 9/2001 | Fujisawa et al. | |
| 6,349,068 B2 | 2/2002 | Takemae et al. | |
| 6,421,281 B2 | 7/2002 | Suzuki | |
| 6,449,204 B1 * | 9/2002 | Arimoto et al. | 365/222 |
| 6,515,928 B2 | 2/2003 | Sato et al. | |
| 6,519,199 B2 | 2/2003 | Ku | |
| 6,590,822 B2 * | 7/2003 | Hwang et al. | 365/222 |
| 6,741,515 B2 | 5/2004 | Lazar | |
| 6,834,021 B2 * | 12/2004 | Mori et al. | 365/222 |
| 6,862,238 B1 | 3/2005 | Lee | |
| 6,888,776 B2 * | 5/2005 | Watanabe et al. | 365/194 |
| 6,922,943 B1 * | 8/2005 | Paille et al. | 47/47 |
| 6,947,346 B2 | 9/2005 | Shore et al. | |
| 6,961,282 B2 * | 11/2005 | Son | 365/230.06 |
| 7,079,439 B2 | 7/2006 | Cowles et al. | |
| 7,139,208 B2 | 11/2006 | Arimoto et al. | |
| 7,705,625 B2 * | 4/2010 | Yoo et al. | 326/26 |

(Continued)

FOREIGN PATENT DOCUMENTS

JP    2000-156085 A    6/2000

(Continued)

*Primary Examiner* — Viet Q Nguyen
(74) *Attorney, Agent, or Firm* — John P. O'Banion

(57) ABSTRACT

An apparatus and method for reducing power consumption within dynamic memory devices having internal self-refresh circuitry. The circuits for generating isolator control (ISO), pre-decoded row address (PXID) and/or word enable (WE) signals are configured in response to receipt of self-refresh and refresh counter signals to output different timing and sequencing when in self-refresh mode than when in normal mode of the memory device. Conventionally, ISO signals are controlled from a block selection circuit which also controls bit line equalization (BLEQ) and sense amplifier enable (SAPN). While in conventional circuits the PXID and WE signals are generated in response to the output of the address decoder and thus have a fixed timing in relation to the output of the address decoder. The use of different timing and sequencing can lower power consumption, such as by outputting fewer signal transitions per block during self-refresh.

7 Claims, 12 Drawing Sheets

U.S. PATENT DOCUMENTS

| | | |
|---|---|---|
| 7,800,961 B2 * | 9/2010 | Son et al. ............... 365/189.09 |
| 2002/0001248 A1 | 1/2002 | Ku |
| 2002/0024865 A1 | 2/2002 | Fujieda et al. |
| 2002/0027234 A1 | 3/2002 | Kato et al. |
| 2002/0191467 A1 | 12/2002 | Matsumoto et al. |
| 2003/0028712 A1 | 2/2003 | Horiguchi et al. |
| 2003/0067825 A1 | 4/2003 | Shimano et al. |
| 2003/0128614 A1 | 7/2003 | Hidaka et al. |
| 2003/0231540 A1 | 12/2003 | Lazar et al. |
| 2004/0125680 A1 | 7/2004 | Kim |
| 2004/0184336 A1 | 9/2004 | Shore et al. |
| 2007/0070767 A1 | 3/2007 | Im et al. |

FOREIGN PATENT DOCUMENTS

| | | |
|---|---|---|
| KR | 10-2004-0025186 A | 3/2004 |
| KR | 10-0672127 B1 | 1/2007 |
| KR | 10-2007-0078934 A | 8/2007 |

* cited by examiner

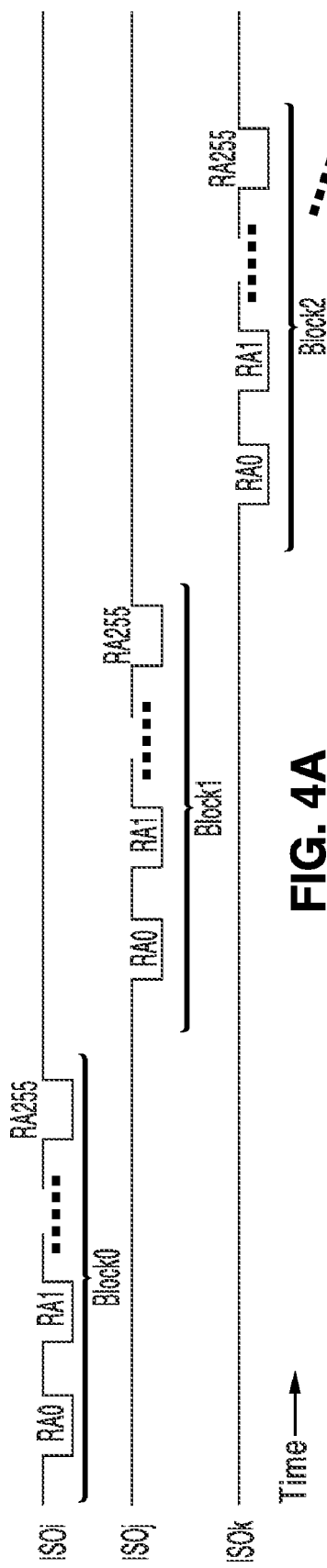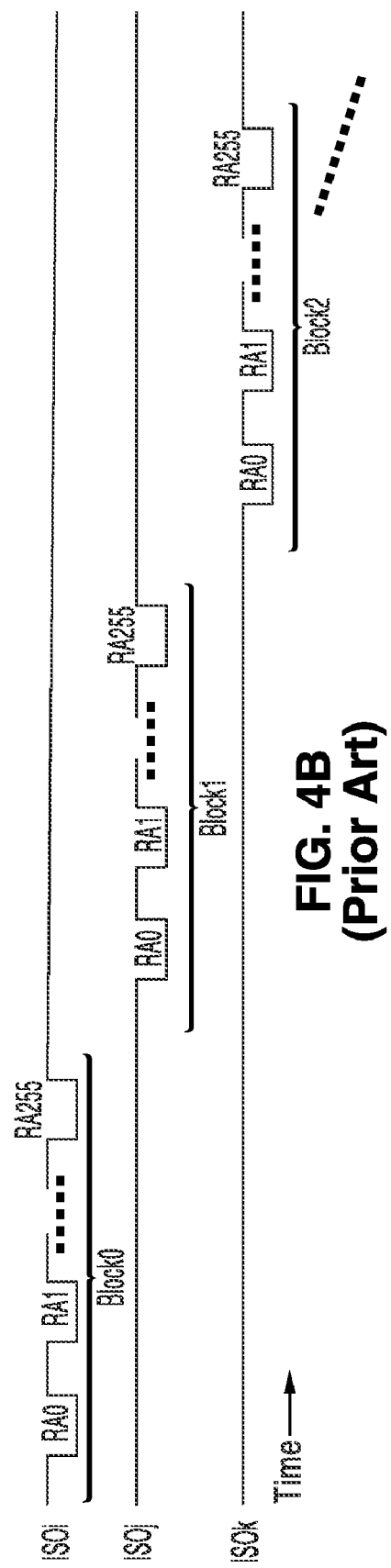

MEMORY DEVICE WITH SELF-REFRESH OPERATIONS

CROSS-REFERENCE TO RELATED APPLICATIONS

This application claims priority from U.S. provisional application Ser. No. 61/013,081 filed on Dec. 12, 2007, incorporated herein in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention pertains generally to dynamic semiconductor memory, and more particularly to dynamic memory having self-refresh circuitry.

2. Description of Related Art

Dynamic random access memory (DRAM) stores each bit of data in a separate capacitor within the integrated circuit. In response to the leakage of the capacitors, the information stored in response to capacitor charge must be periodically refreshed. In view of the non-static nature of these memories they are referred to as dynamic memories. The refresh operations of the memory can be performed in response to signals from external circuits, and/or in response to internal refresh circuits.

FIG. 1 depicts a block diagram for a typical dynamic memory array, showing four arrays of memory cells between each of which are Bit Line Sense Amplifiers (BLSA) and equalizers (EQ), such as Bit Line Equalizers. At the bottom of the schematic are shown circuitry for generating Sense Amplifier Activation signals (SAPN controlling both P and N channel sense amplifier (SAP) and (SAN), or equivalent), isolator control signals (ISO), and Bit Line Equalization (BLEQ) signals.

FIG. 2 is a detailed circuit diagram of typical BLSA, CSL and EQ circuits. Signals are shown connected in the figure, including bit lines and bit line complement for left and right (BL_L, BLB_L, BL_R, BLB_R), Bit Line Voltage (VBL), Bit Line Equalization (BLEQ), isolation control signal left and right (ISOL and ISOR), input/output and complement (IO, IOB), column select line (CSL), P and N channel sense amplifier enable signals (SAP and SAN signals which are collectively referred to as SAPN), as well as amplifier latch and complement (LA, LAB). A typical memory array comprises multiple cell array blocks, Bit Line Sense Amplifiers (BLSA), Column Select Lines (CSL), Bit Line Equalizers (BLEQ), Isolators, isolator control signal (ISO) and associated control signal generators. During a normal memory operation, the control circuits respond to address and command signals fed from an external source.

FIG. 3 is an example block diagram of a conventional isolation control (ISO) generation scheme. Block selection is seen performed in response to decoding of address and commands from the received address and command buffer. The command buffer controls row address selection (RAS Active), self refresh control (Self-Refresh), including a refresh counter (Refresh Counter), with these signals being received by an address decoder (Address Decoder) whose output controls block selection. The output of the block selection circuit selectively activates: (1) cell array block isolator (ISO Gen.) to prevent interference and unintended disturbance; (2) BLSA and BLEQ (BLEQ Gen.) for the activated cell array block to equalize and amplify information stored in the selected cell array block and eliminate voltage differences on bit lines, while BLSA senses and amplifies the electrical signal differences on bit lines; and (3) controls sense amplifier activation signals SAN, SAP (SAPN Gen.).

FIGS. 4A and 4B are timing diagrams for conventional ISOi generation shown operating for normal and auto-refresh modes in FIG. 4A, and in self-refresh operation in FIG. 4B. It should be noted that auto-refresh is categorized with normal operating modes because auto-refresh uses the internal counter of the memory to refresh its rows, wherein multiple row addresses don't need to be put on the address bus to refresh multiple rows. Accordingly, references to normal operating mode, or modes, includes the operation of auto-refresh in the following discussions.

By way of example, during self-refreshing of a cell array block consisting of 256 word lines, a conventional self-refresh control scheme generates an isolation signal (ISO) 256 times, once for each activated word line of the cell array block, wherein each isolation signal generated swings the control voltage between control signal low and high. It should be appreciated that the current consumed by conventional isolation signals during self-refresh operation is directly proportional to the number of isolation signals generated for self-refresh operation of the 256 word lines. Therefore, current is consumed for each ISO (ISOi-ISOk) transition for a block containing 256 word lines wherein the ISO lines are activated 256 times which comprises 512 transitions (each activation having a first and second transition-edge).

FIG. 5 is an illustrative circuit diagram of a conventional word line driver, shown with multiple blocks on successive tiled sections. It will be appreciated that typical word line drivers comprise plural pre-decoded row address drivers (PXID) and plural word enable (WE) lines. Historically, word enable lines were used to directly control access to memory cells. As the density and complexity of integrated circuit grew, the number of WE lines had grown to a point where the number of WE lines would not physically fit in the integrated circuit and necessitated multi-dimensional access control scheme. In this two dimensional control scheme, each WE line contains information for 8 sub-word lines while PXID further down-selects one sub-word line from 8 sub-word lines. The signal PXID is a driver output for the signal PXI. The signal WEi represents a word enable (WE) signal for a given block or page of memory within the memory device.

It should be appreciated that the ISO generator block is controlled by the output of "Block Selection" which also controls BLEQ generation and SAPN generation for bit line sense amplifiers. The conventional control arrangement thus controls ISO generation with the same block selection as controls the BLEQ and SAPN. Consequently, in the conventional configuration ISO is controlled the same way regardless of whether the array is performing a normal operation or a self-refresh operation.

FIG. 6 illustrates a conventional PXI generation scheme in which one refresh counter controls both normal operation and self-refresh operation through the address decoder (Address Decoder). This control scheme lacks the flexibility to control timing and sequence of PXI or WEI in response to normal operation or self-refresh modes. It will be seen in the figure that the address decoder receives input from the address buffer as well as from the command buffer whose signals are directed to RAS active, self-refresh, and the refresh counter feeding the address decoder. Output from the address decoder drives the PXI, PXID and WEI generation circuits.

FIGS. 7A and 7B are timing diagrams for conventional PXID and WEI generation shown operating for normal and auto-refresh modes in FIG. 7A, and in self-refresh operation in FIG. 7B.

Similar to the situation with ISO generation, the conventional self-refresh control scheme generates pre-decoded row address (PXI or PXID) and main word enable (WE or WEI) signals 256 times each, wherein each PXID and WE signal generated swings the control voltage between control signal low and high. Current consumed by conventional PXID and WE signals during self-refresh operation is directly proportional to the number of PXID and WE signals generated for self-refresh operation of 256 word lines. Conventional PXID and WE generation is shown in FIG. 7A-7B. Therefore, it is seen that current is consumed for each PXID and WE transition, wherein for a block containing 256 word lines each PXID and WE is activated 256 times per block.

Therefore, it is desirable to reduce current consumption within dynamic memory circuits without impacting operating characteristics. The present invention satisfies those needs, as well as others, and overcomes the deficiencies of previously developed power reduction schemes.

BRIEF SUMMARY OF THE INVENTION

The present invention pertains to a memory device with self-refresh operations. In one embodiment the memory device is a semiconductor memory device with lowered current consumption during self-refresh operations.

By way of example, and not of limitation, circuits and methods for controlling self-refresh operation within dynamic semiconductor memory devices are described. Apparatus and methods are taught for reducing current consumption in response to controlling self-refresh operations, in particular the timing and sequencing of control signals in order to reduce voltage swing of control signals. The present invention recognizes that by separating the circuitry in response to self-refresh operations, that certain sequence and timing can be altered toward reducing power consumption within the memory device.

Self-refresh according to the present invention is preferably performed system wide as described, however, partial forms of self-refreshing (e.g., by block and so forth) are supported as well without departing from the teachings of the present invention.

Power consumption is reduced by internal self-refresh circuitry which generates ISO separately from Block Selection, and/or by generating other signals, in particular PXID and WEI, in a different manner during self-refresh operations than when operating in normal (non-self-refresh) modes.

The present invention exploits the fact that a self-refresh operation is controlled internally within the memory device, while eschewing conventional control schemes which rely on common control circuitry between normal and self-refresh operations, therein restricting sequence and timing of control signals similarly between normal and self-refresh operations. Unlike operations of memory devices controlled by external signals, or which can select between either internal or external control; internally controlled self-refresh operations within the present invention are configured to reduce consumption (and/or improve performance) without compromising external signaling and interface requirements. It should be appreciated that tradeoffs are often made in memory circuits between power consumption and performance parameters, wherein changes which reduce power consumption, can be adopted toward achieving higher performance operation at a given level of power consumption. To reduce current consumption (or increase performance for a given level of power consumption) during self-refresh operation, the invention controls timing and sequencing of isolation and address decoder signals.

The invention is amenable to being embodied in a number of ways, including but not limited to the following descriptions.

One embodiment of the invention is a semiconductor memory device which includes internal self-refresh circuitry, comprising: (a) means for generating bit line equalization (BLEQ), sense amplifier enable (SAPN), and isolator control (ISO) signals responsive to the receipt of address decoder output (e.g., in response to address buffer, command buffer, RAS active, self-refresh and refresh counter); (b) means for generating pre-decoded row address (PXID) and word enable (WE) signals in response to receipt of output from the address decoder, in which the signals are generated solely in response to the address decoder and exhibit the same timing and sequencing in both normal modes and a self-refresh mode of the memory device; (c) means for generating isolator control (ISO), pre-decoded row address (PXID) and/or word enable (WE) signals differently in response to a self-refresh mode of the memory device than when in a normal mode of the memory device. The circuits generating the isolator control (ISO), pre-decoded row address (PXID) and/or word enable (WE) receive self-refresh and refresh counter signals in addition to an address decoder signal. Furthermore, ISO, PXID and/or WE are output with different timing and sequencing when in self-refresh mode than when in normal mode. By utilizing different timing and sequencing of ISO, PXID and/or WE signals, the average voltage swing of these control signals can be reduced, thus leading to significant power savings within self-refreshing dynamic memory circuits. For example, the different timing and sequencing of ISO, PXID and/or WE preferably comprises outputting fewer signal transitions when in self-refresh mode than when in normal modes resulting in a reduction of operating current for a given frequency of operation.

The semiconductor memory device can be configured in a number of different ways according to the present invention. One implementation aspect is in which the means for generating ISO, PXID and/or WE signals is configured with a block iso-selection circuit for controlling ISO generation in response to receipt of a self-refresh and refresh counter signal. It should be appreciated that additional signals could be incorporated (e.g., utilized by the block iso-selection circuit) as desired for a given implementation, without departing from the teachings of the present invention. In this aspect of the invention, the ISO generation is determined in response to timing and sequencing set by the block iso-selection circuit, instead of in response to the block selection circuit (which is present in every conventional dynamic memory circuit) whose output controls the generation of BLEQ and SAPN signals. It should be appreciated that in conventional memories the block selection circuit controls the operation of the ISO, BLEQ, and SAPN signals with a sequence and timing shared between normal and self-refresh modes. Thus, in this aspect of the present invention the ISO generation timing and sequencing can be changed independently of BLEQ and SAPN in response to self-refresh mode. In another implementation aspect the circuit can be configured with either or both the PXID and WE signals able to vary in sequencing or timing and thus need not adhere to the timing set by the address decoder output. In one aspect the means for generating isolator control (ISO), pre-decoded row address (PXI or PXID) and/or word enable (WE or WEI) signals is configured for controlling PXID signal generation from a PXID generation circuit which receives self-refresh, refresh counter, and address decoder signals for establishing a different timing and sequencing than the WE signals when the memory device is in a self-refresh mode. In another aspect the means for generating isolator control (ISO), pre-decoded row address (PXI or PXID) and/or word enable (WE or WEI) signals is configured for controlling WE signal generation from a WE generation circuit which receives self-refresh, refresh counter, and address decoder signals for establishing a different timing and sequencing than the PXID signals when the memory device is in a self-refresh mode. It should be appreciated that changing ISO, PXID and WE sequencing and timing can be done singularly or in various combination with one another and what is known in the art without departing from the teachings of the present invention.

One embodiment of the invention is a memory circuit for dynamic semiconductor memories which include self-refresh capability, comprising: (a) an internal self-refresh circuit configured for refreshing the memory cells within the blocks of a dynamic semiconductor memory and controlling bit line equalization (BLEQ), sense amplifier enable (SAPN), isolator control signals (ISO), pre-decoded row address (PXID) and word enable (WE); and (b) an address decoder in the internal self-refresh circuitry which is configured for decoding memory addresses in response to the inputs of address, command, row activation selection (RAS), self-refresh, and refresh counter. The self-refresh circuit in this embodiment is configured for controlling the generation of one or more of the signals selected from ISO, PXID, and WE, in response to signals from the address decoder along with additional signals including those from the self-refresh circuit and the refresh counter. The ISO, PXID, and/or WE signals can be selectively output during self-refresh mode operations with different timing and sequencing than when the memory circuit is in a normal operating mode. For example, the different timing and sequencing of the memory circuit when in self-refresh mode preferably comprises outputting fewer signal transitions thus leading to reduced operating current for a given frequency of operation.

The semiconductor memory device can be configured in a number of different ways according to the present invention. In one implementation, the self-refresh circuit is configured for controlling ISO generation separate from block selection which is used to drive ISO generation and other signals in a typical memory device. The added block iso-selection circuit receives signals from the address decoder as well as from at least the self-refresh and refresh counter (other signals may be coupled to it as desired) so that ISO generation timing and sequence can be changed independently, such as independent of either BLEQ or SAPN, or other associated circuits. Thus, in this implementation, the self-refresh circuit is configured with a block iso-selection circuit in addition to a block selection circuit.

It will be noted that the block selection circuit is configured for driving the bit line equalization (BLEQ), sense amplifier enable (SAPN) in the same manner when in normal and self-refresh modes. It will be noted that in a conventional dynamic memory device, the block selection controls ISO, BLEQ and SAPN with the same timing in both normal and self-refresh modes. By contrast, this implementation has the additional circuit, block iso-selection, which is configured to allow driving the isolator control signals (ISO) with different sequencing and timing than the circuits controlled by the block selection circuit.

One example of how different sequence and timing can change the power consumption is that fewer output transitions can be generated when in the self-refresh mode than when in normal operating mode, wherein significant power can be saved. In another implementation, the self-refresh circuit is configured for combining pre-decoded row address (PXID) and/or word enable (WE) signals to reduce the number of PXID and/or WE signals being generated during the self-refresh mode. In one mode, the self-refresh circuit is configured for driving either PXID and/or WE in response to the output of the address decoder as well as in response to self-refresh and refresh counter. Preferably, the refresh counter contains at least two counters, one counter (e.g., a 1up counter) providing conventional (random) timing, with a second counter (e.g., an 8up counter) providing alternative timing for self-refresh wherein the access is preferably according to a desired sequence used to reduce transitions and simplify refresh operations. Alternatively, a single counter can be configured in response to signal receipt to provide different modulo counting as desired. Current is reduced using this implementation in response to changing the timing and sequencing of a control signal in order to reduce voltage swing of the output, such as by reducing the number of output transitions of the control signals. It should be appreciated that changing ISO, PXID and WE sequencing and timing can be performed separately or in combination according to different aspects of the present invention.

One implementation of the invention is a memory circuit for dynamic memories having self-refresh capability, comprising: (a) address and command buffers configured for receiving address and command information for controlling memory operations; (b) a row activation selection (RAS) circuit coupled to the command buffer; (c) a self-refresh circuit coupled to the command buffer; (d) at least one refresh counter coupled to the self-refresh circuit; (e) an address decoder configured for receiving the output from the address buffer, RAS circuit, self-refresh circuit and refresh counter; (f) a block selection circuit coupled to the address decoder and configured for driving bit line equalization (BLEQ) circuits and sense amplifier enable signals (SAPN); (g) a circuit for generating isolator control signals (ISO), pre-decoded row address drivers (PXID) and plural word enable (WE) lines selected from one or more of the following: (g)(i) a block ISO selection circuit configured for driving an ISO generation circuit adapted for generating isolator control signals, wherein the block ISO selection circuit is configured with separate sequencing and/or timing, than the block selection circuit, in response to self-refresh mode operations of the memory circuit, wherein the block ISO selection circuit can selectively output fewer ISO signal transitions during self-refresh mode operations of the memory circuit than when in normal operating modes to mitigate power consumption for a given operating frequency; (g)(ii) a pre-decoded row address driver (PXID) circuit coupled to the self-refresh control circuit and to at least one counter of the refresh counter, in addition to being coupled to the address decoder, wherein the PXID circuit is configured with separate sequencing and/or timing than if it were only coupled to the address decoder, such that the PXID circuit can selectively output fewer PXID signal transitions during self-refresh mode operations of the memory circuit than when in normal operating modes; (g)(iii) a word enable (WE) circuit coupled to the self-refresh control circuit and to at least one counter of the refresh counter, in addition to being coupled to the address decoder, and wherein the WE circuit is configured with separate sequencing and/or timing than if it were only coupled to the address decoder, wherein the WE circuit can selectively output fewer WE signal transitions during self-refresh mode operations of the memory circuit than when in normal operating modes.

In one implementation of the above, the memory circuit is configured with the block iso-selection circuit coupled to the address decoder, the self-refresh circuit, and the refresh counter. In at least one mode of the invention the block iso-selection circuit generates isolator control signals similar to that of a conventional ISO generation circuit coupled to the same block selection circuit to which the bit line equalization (BLEQ) circuits and sense amplifier enable signals (SAPN) are coupled.

One implementation of the invention is a method for reducing power consumption within a semiconductor memory circuit configured for self-refresh operation, comprising: (a) decoding memory addresses to generate an address decoder signal in response to the receipt of address and command information (e.g., including address buffer, command buffer, row activation selection (RAS), self-refresh, and refresh counter inputs); (b) generating bit line equalization (BLEQ), sense amplifier enable (SAPN), isolator control signals (ISO), pre-decoded row address (PXID) and word enable (WE) in response to the decoding of memory addresses; and (c) controlling the ISO, or the PXID, or the WE, or a combination of the ISO, PXID, and WE, differently when in self-refresh mode than when in normal modes in response to receiving self-refresh and refresh counter signals within circuitry capable of providing different timing than provided by the output of the address decoder signal. It should be recognized that power consumption can thus be reduced in response to generation of the ISO, PXID, and/or WE signals with different timing and sequencing than when the memory circuit is in a normal operating mode. For example, the number of transitions of the respective signals can be reduced toward reducing overall power consumption for a given frequency of operation.

As mentioned already, the semiconductor memory device can be configured in a number of different ways according to the present invention. For example, the method can be configured for controlling the generation of isolator control signals (ISO) with a block iso-selection circuit configured for separately controlling ISO generation from the generation of bit line equalization (BLEQ) and sense amplifier enable (SAPN). In this example the block iso-selection circuit receives signals from the address decoder as well as from at least the self-refresh and refresh counter signals allowing ISO generation timing and sequencing to be changed independently of other circuits operating from the output of block selection, such as BLEQ and SAPN when the semiconductor memory is in self-refresh mode. In another aspect the generating of pre-decoded row address (PXID) signals, word enable (WE) signals, or a combination of PXID and WE signals, is configured for outputting different timing and sequencing of PXID and/or WE when the memory circuit is in a self-refresh mode than when the memory circuit is in a normal operating mode. The generation of PXID and WE signals is performed in response to receipt of the address decoder signal, which is also received in a conventional memory device, but generating PXID, WE, or a combination of PXID and WE, according to an aspect of the present invention is done in response to separate receipt of self-refresh and refresh counter signals.

The present invention provides a number of beneficial aspects which can be implemented either separately or in any desired combination without departing from the present teachings.

An aspect of the invention is the reduction of power consumption in memory devices having self-refresh circuitry.

Another aspect of the invention is separating portions of the circuitry associated with generating isolator control (ISO) signals, or pre-decoded row address (PXID), or word enable (WE) signals, or combinations thereof, with additional circuitry receiving self-refresh control information and refresh counter information to establish, for one or more of these signals, different timing and sequencing in self-refresh mode than when in normal mode.

Another aspect of the invention is separating the generation of isolator control (ISO) signals from the conventional block selection circuit which also typically controls at least the output of bit line equalization (BLEQ), sense amplifier enable (SAPN).

Another aspect of the invention is adding a circuit, herein referred to as block iso-selection, which generates block selection control signals to drive the ISO generator circuit, instead of the block selection circuit.

Another aspect of the invention is the use of a block iso-selection circuit which is configured for receiving address decoder information, which are also received by a conventional block selection circuit, but the block iso-selection circuit also receives refresh control and counter information wherein different timing may be established for the ISO signals than if directed by the block selection circuit.

Another aspect of the invention is separating the generation of either pre-decoded row address (PXID) signals, or word enable (WEI) signals, or a combination of both, from being subject only to the timing imposed by the address decoder circuit.

Another aspect of the invention is the addition of circuitry to the PXID and/or WEI circuit which is configured for controlling the sequencing and timing of these signals in response to both the address decoder output as well as self-refresh control information and refresh counters, wherein the sequence and timing of these signals is not constrained to follow the address decoder.

Another aspect of the invention is that of lowering the power consumption of the memory device, for a given operating speed, in response to changing of the sequence or timing of ISO, PXID, or WEI output.

Another aspect of the invention is that of lowering the power consumption of the memory device, for a given operating speed, such as in response to reducing the number of transitions generated during self-refresh for one or more of the signals ISO, PXID, or WEI output.

A still further aspect of the invention is provide enhanced operating characteristics for a dynamic memory device performing internal self-refresh operations.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIGS. 4A and 4B are a timing diagrams for a conventional ISOi control timing diagram.

DETAILED DESCRIPTION OF THE INVENTION

Referring more specifically to the drawings, for illustrative purposes the present invention is embodied in the apparatus generally shown in FIG. 8 through FIG. 12C. It will be appreciated that the apparatus may vary as to configuration and as to details of the parts, and that the method may vary as to the specific steps and sequence, without departing from the basic concepts as disclosed herein.

Figure 8:
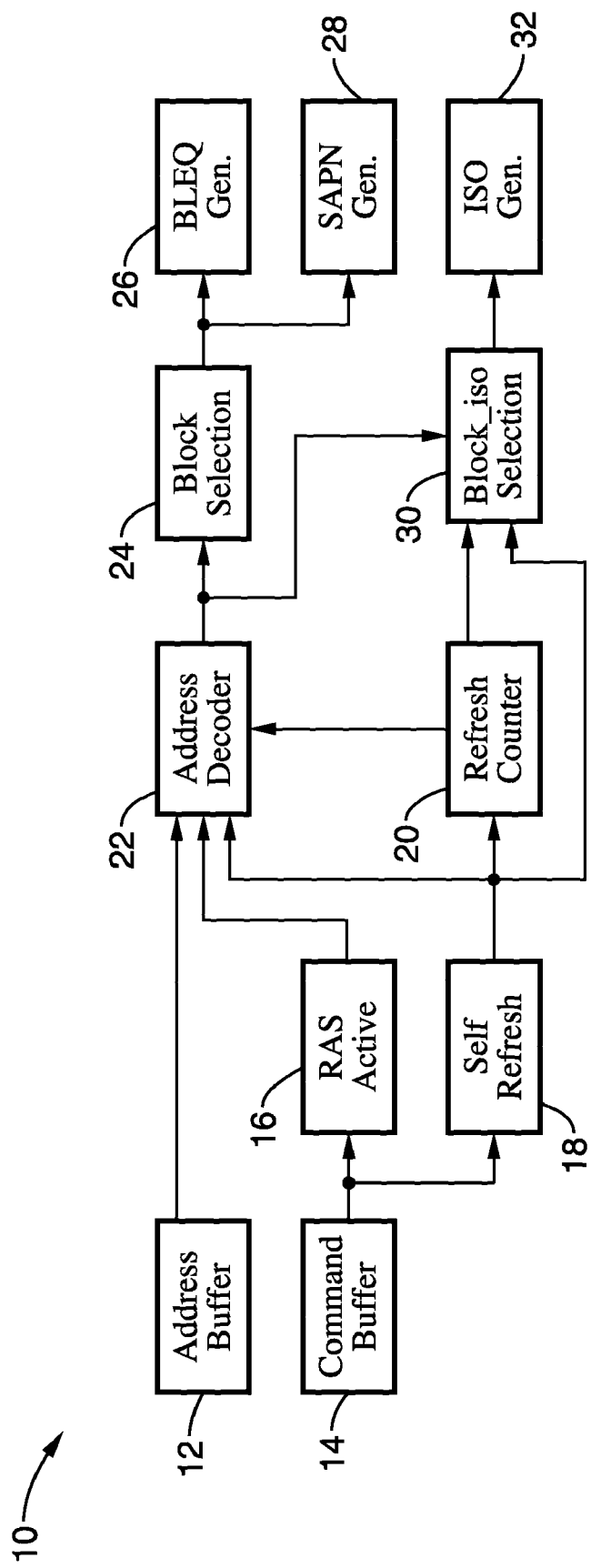
FIG. 8 is a block diagram of an ISO generation scheme according to an embodiment of the present invention, showing the ISO generation circuit being driven separately from the BLEQ and SAPN circuits.

FIG. 8 is a block diagram of an inventive ISO generation embodiment 10. Unlike a conventional ISO generation scheme, in the present invention ISO generation is controlled separately from "Block Selection." While the functionalities of BLEQ, SAPN and ISO can be unchanged from that of the conventional scheme, separation of ISO generation control allows flexibility, such that ISO generation timing and sequencing can be changed independently of BLEQ and SAPN. This inventive method and apparatus provides flexibility to change ISO timing and sequence during self-refresh operations while assuring normal operating capabilities.

It will be appreciated that self-refresh operation is utilized within a dynamic memory to maintain appropriate retention voltage levels within the respective memory cells. Conventional self-refresh control schemes share common block selection, address decoder and refresh counter with externally controlled operations, wherein every cell block and cell within each cell block is accessed in a single step increment or decrement during self-refresh operations. It has been recognized in the present invention that due to restrictions imposed by shared block selection, address decoder and refresh counters, conventional self-refresh schemes lack flexibility to change self-refresh control signal timing and sequencing in order to reduce current consumption and/or enhance performance.

By contrast to these conventional schema, the present invention utilizes additional control apparatus, in particular a block iso-selection circuit to control ISO generation in response to whether the device is in normal operating mode or in self-refresh mode.

In the figure, address and command information are received in address buffering 12 and command buffering 14, respectively. The command buffer 14 output controls row address selection (RAS) activation 16 and self refresh control 18, including refresh counter 20. The outputs of RAS 16, self-refresh 18, and refresh counter 20, in addition to the output from address buffer 12, are directed to an address decoder 22. Output from address decoder 22 is directed to a block selection circuit 24 configured for controlling BLEQ generation 26 and SAPN generation 28. Signals from self-refresh 18, refresh counter 20 as well as address decoder 22 are directed to a block iso-selection circuit 30, which is configured for controlling ISO generation 32. It can be seen in this embodiment that ISO generation 32 is performed in response to a separate and differently-timed block selection circuit which decodes address and commands from the received address and command buffer. It should also be appreciated that one or more counters or other timing elements can be incorporated within the block iso-selection circuit to create any desired timing for driving the ISO signal in response to receipt of the address decoder signal, refresh control signal, and refresh counter signal.

Figure 1:
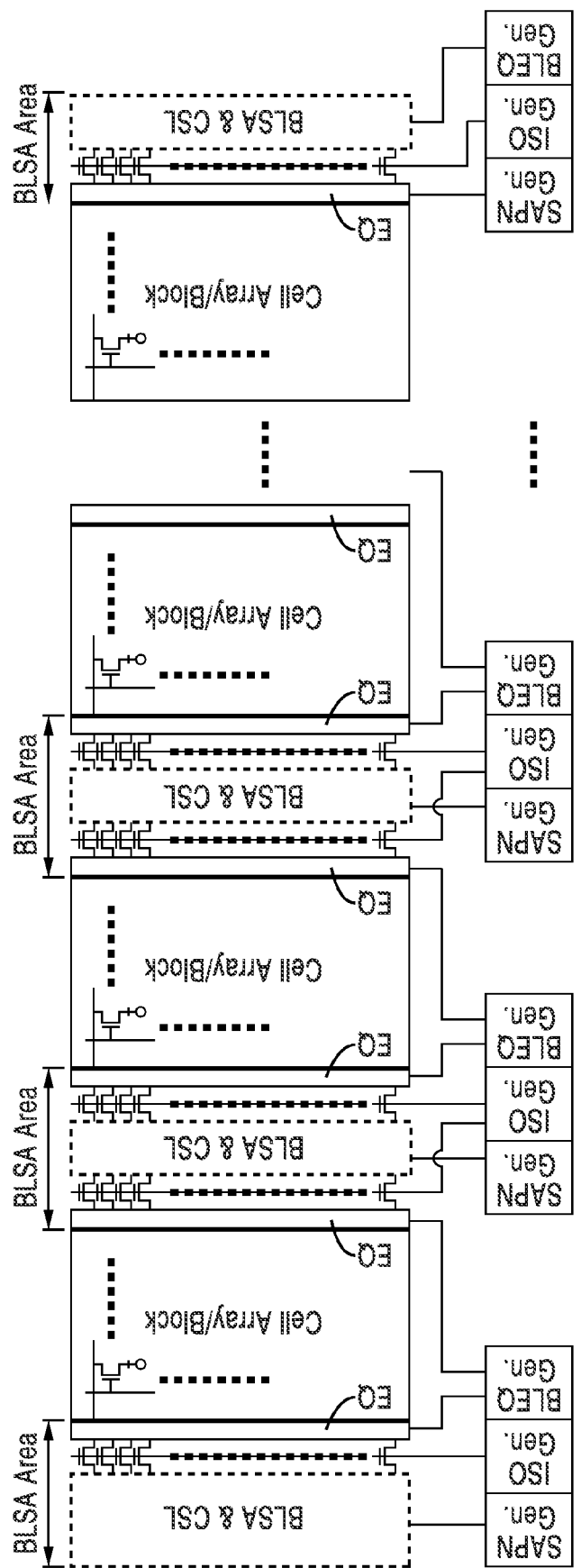
FIG. 1 is an illustrative diagram of a typical memory array block, showing multiple cell array blocks coupled with BLSA, CSA and EQ circuits and controlled by SAPN, ISO, and BLEQ generator circuits.
Figure 2:
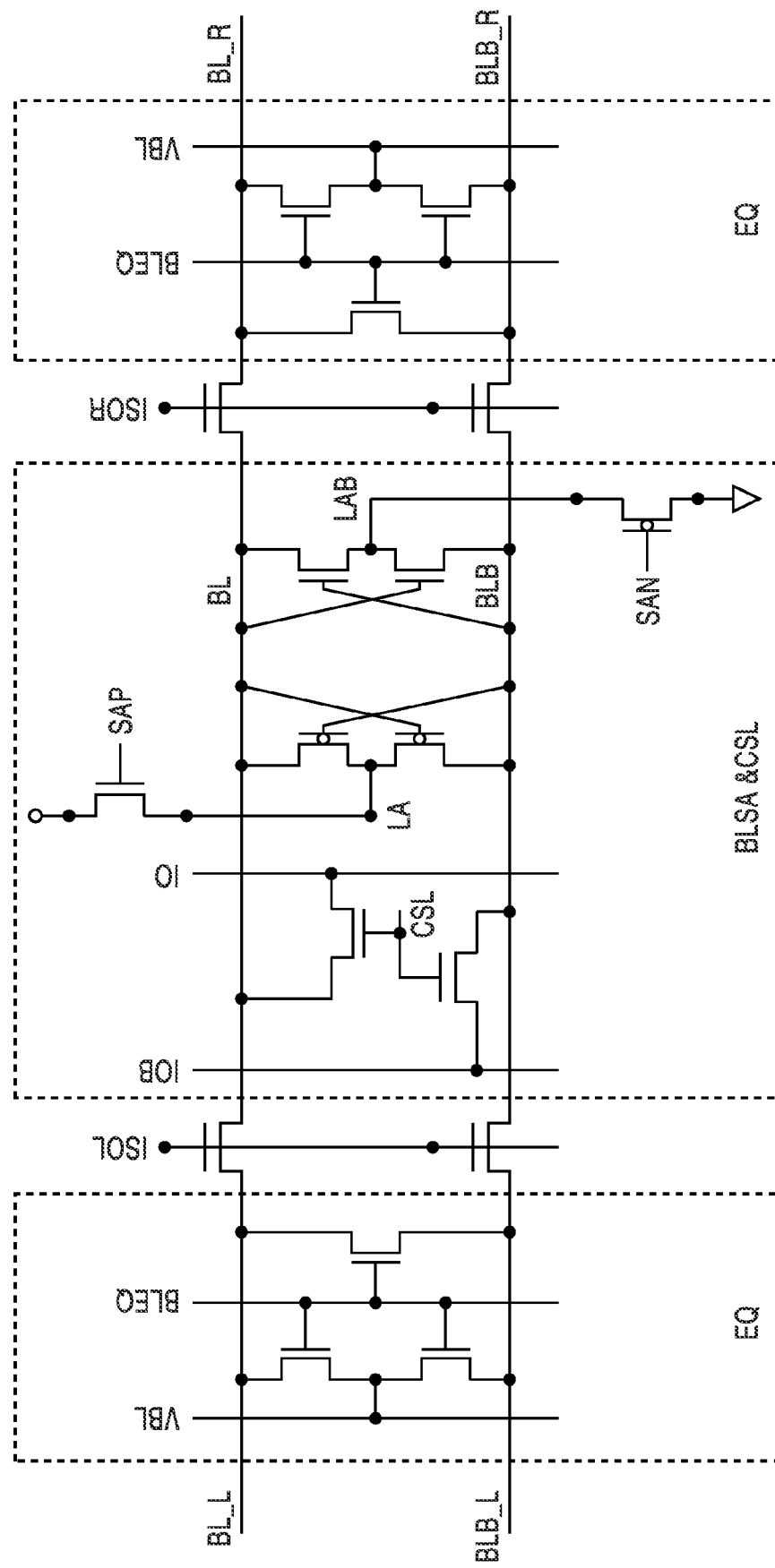
FIG. 2 is a schematic of a typical BLSA area between bit line equalizing sections.
Figure 3:
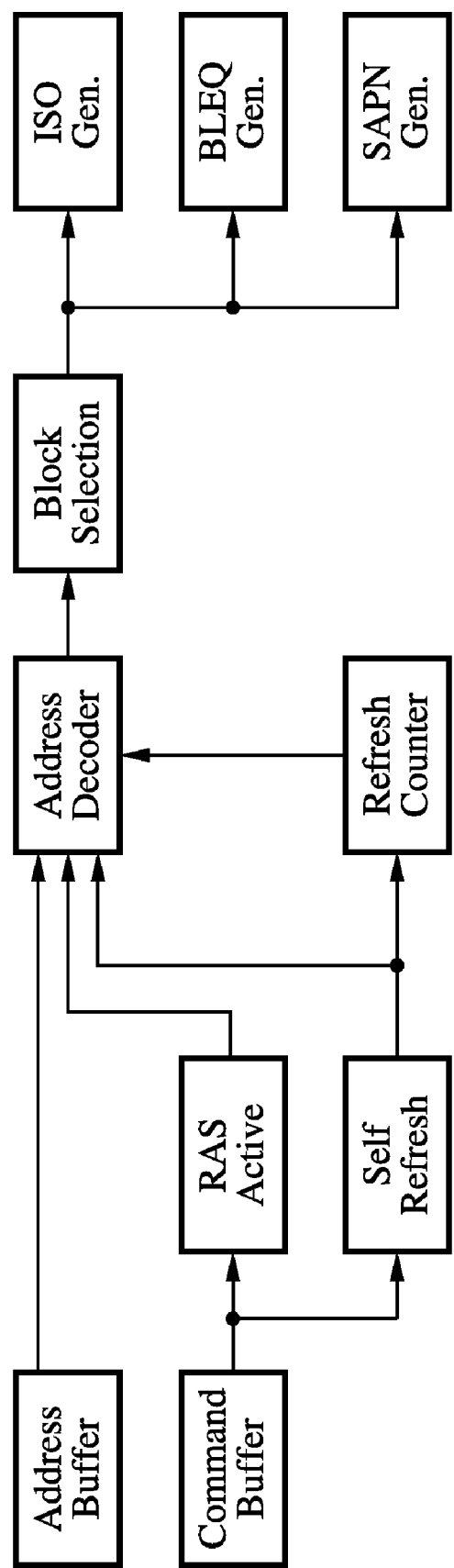
FIG. 3 is a block diagram of a conventional ISO generation scheme, showing ISO, BLEQ and SAPN generation circuits driven from the block selection circuit.
Figure 5:
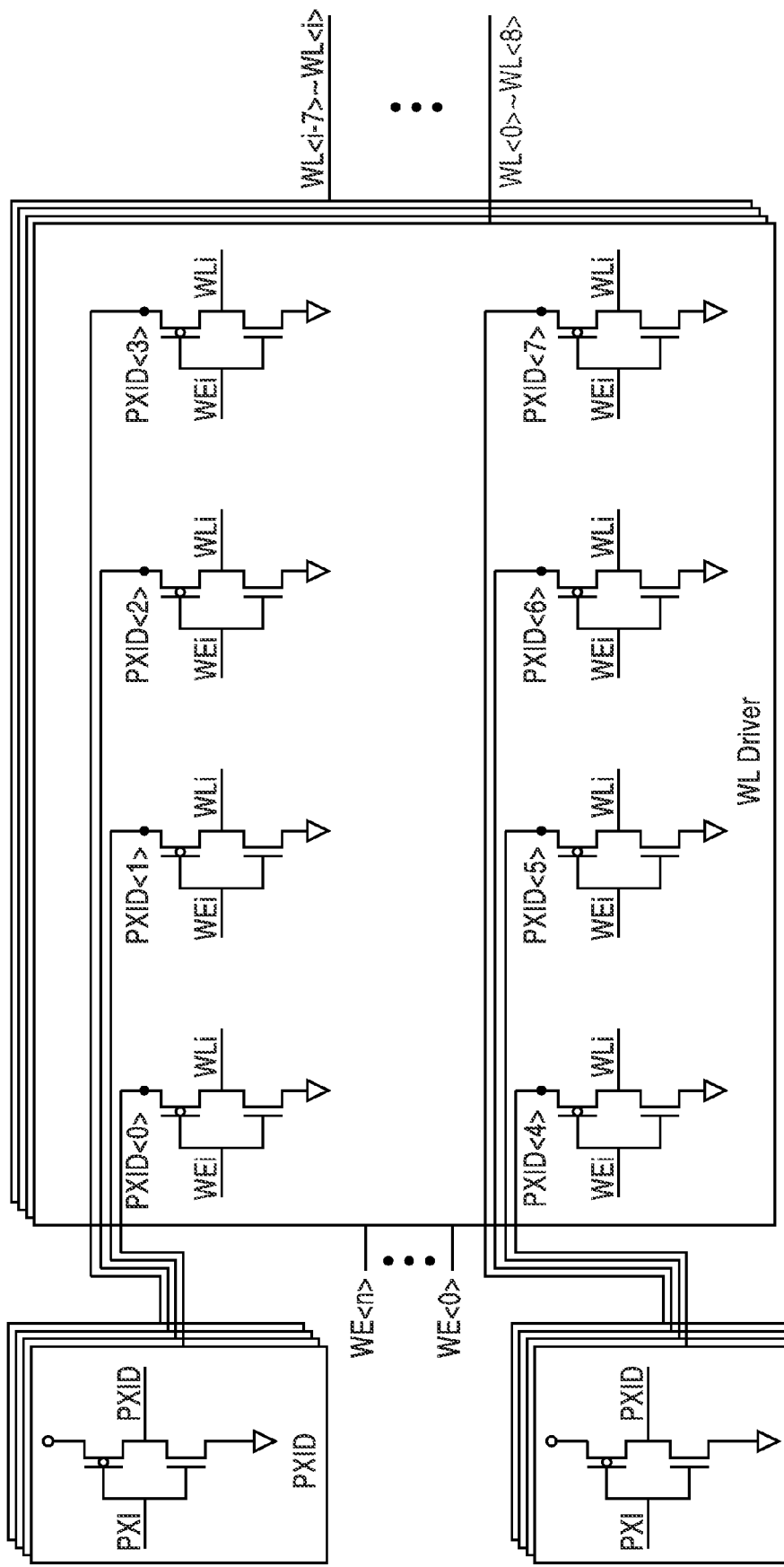
FIG. 5 is block diagram of a conventional multiplexed word line driver.
Figure 6:
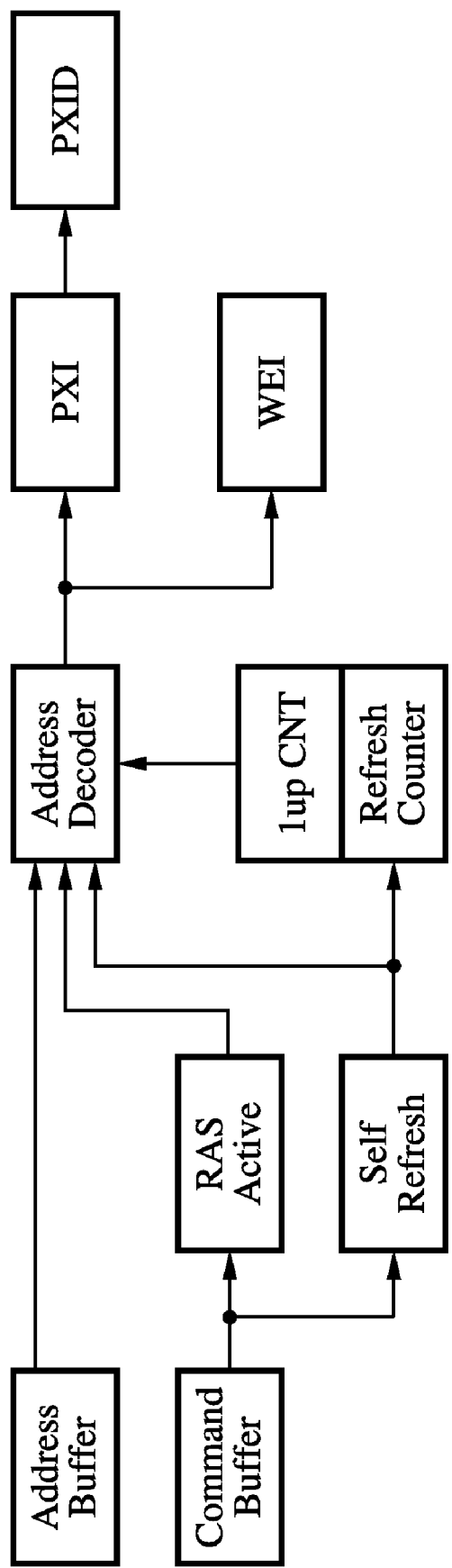
FIG. 6 is a block diagram of a conventional PXID and WEI generation scheme.
Figure 7A:
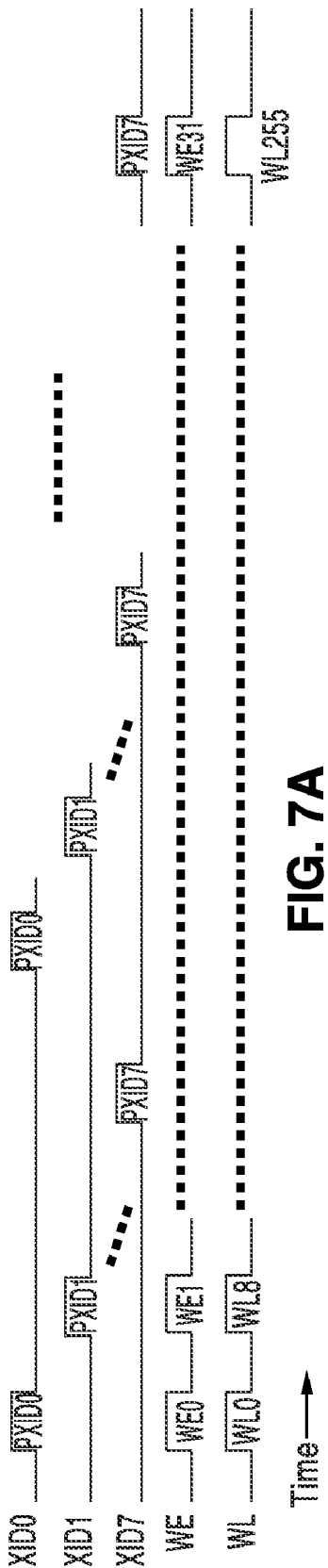
FIGS. 7A and 7B are timing diagrams for a conventional PXID control timing diagram.
Figure 7B:
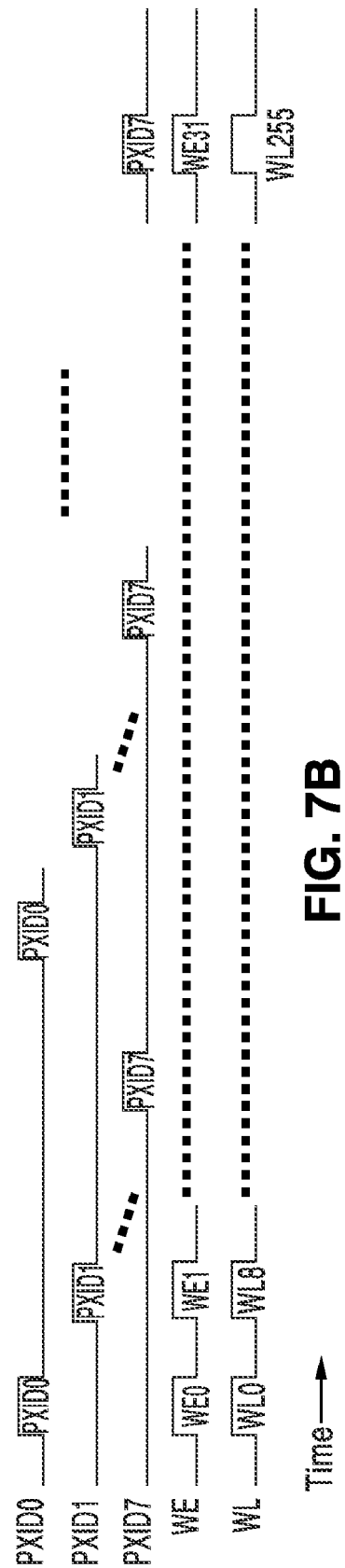

To understand the operation of the inventive circuit, a cell array block containing 256 word lines is considered. Self-refresh of the cell array block with a conventional self-refresh control scheme was previously described for FIG. 3, which required generating an isolation signal (ISO) 256 times, once for each activated word line of the cell array block, whose timing diagram was previously shown in FIGS. 4A and 4B. Each activation of the isolation signal necessarily swings the control voltage between control signal low and high, consuming operating current in response to operating, leakage and capacitive loading. It should be appreciated that the current consumed by conventional isolation signals during self-refresh operation is directly proportional to the number of isolation signals generated for self-refresh operation of the 256 word lines.

By contrast to the above, the present invention utilizes additional control apparatus, such as the depicted block iso-selection 30, as shown in FIG. 8 to reduce power consumption during self-refresh modes. Unlike a conventional self-refresh scheme, the present invention generates the isolation signal (ISO) differently in response to determining whether normal operation or a self-refresh operation is being performed. In the present embodiment information from the command buffer can be used for determining if a self-refresh is being performed, although the apparatus and method can be utilized with any means of determining that self-refresh is being performed. During normal operation, block iso-selection may generate the isolation signal similar to that of a conventional control scheme. During self-refresh operation, however, block iso-selection circuit 30 combines at least two isolation signals for the self-refresh operation. Thus, the number of activations of the ISO signal can be reduced to any desired extent, such as all the way down to the generation of a single ISO signal during block refresh instead of the 256 swings performed conventionally.

Figure 9A:
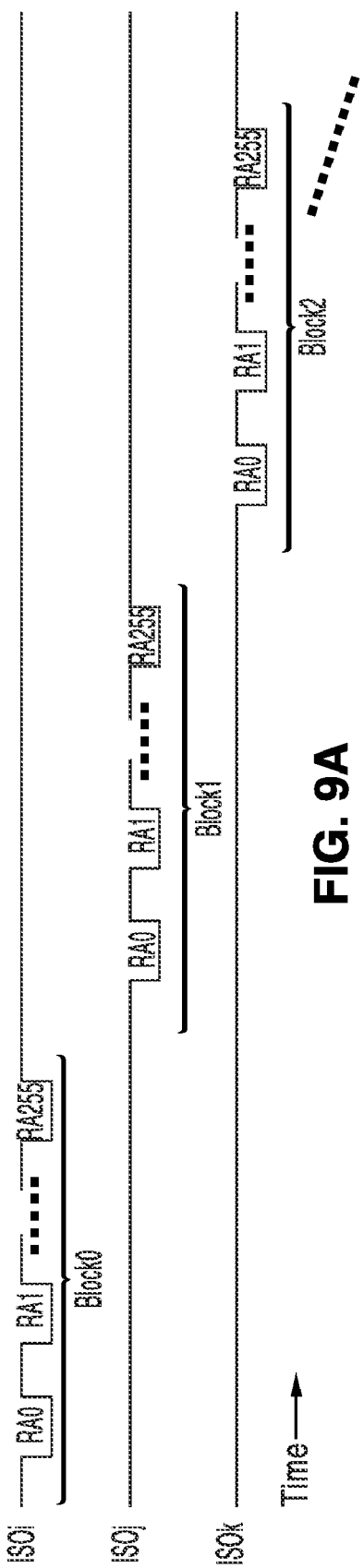
FIGS. 9A and 9B are timing diagrams for an ISOi control timing diagram according to an aspect of the present invention.
Figure 9B:
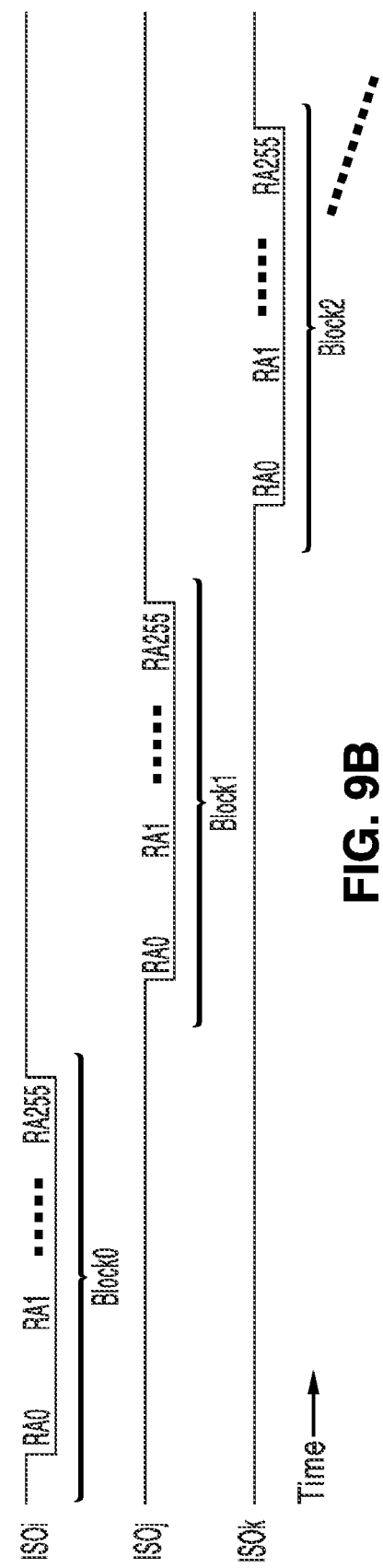

FIGS. 9A and 9B are timing diagrams for the inventive ISO generation method, showing ISO generation in normal and auto-refresh modes in FIG. 9A, and ISO generation in self-refresh mode in FIG. 9B.

During normal or auto refresh modes, the same number, sequence and timing of ISO signals is shown being generated, as for the conventional ISO generation circuit. The timing diagram shows ISO signal generation for three sequential self-refresh cycles, ISOi, ISOj, and ISOk, according to the blocks being self-refreshed. As represented by the diagonal dotted segment at the right side of the figure, the cycles can be extended for any number of memory blocks.

During self-refresh mode, however, in FIG. 9B it will be noted that fewer ISO transitions are required in response to the inventive system.

Although block iso-selection circuit 30 of FIG. 8 can be designed to generate isolation signals of any length depending on related circuit controllability and the stability of internal power generator, such as Vpp (internal high voltage generator) due to leakage current, the longest isolation signal case is shown in FIG. 9B. For example, one isolation signal can be generated and held to complete self-refresh of the cell array block. Self-refresh scheme as depicted in FIG. 8 with timing shown in FIG. 9B can thus reduce components of the current consumption for the isolation signals by a factor of 256.

Figure 10:
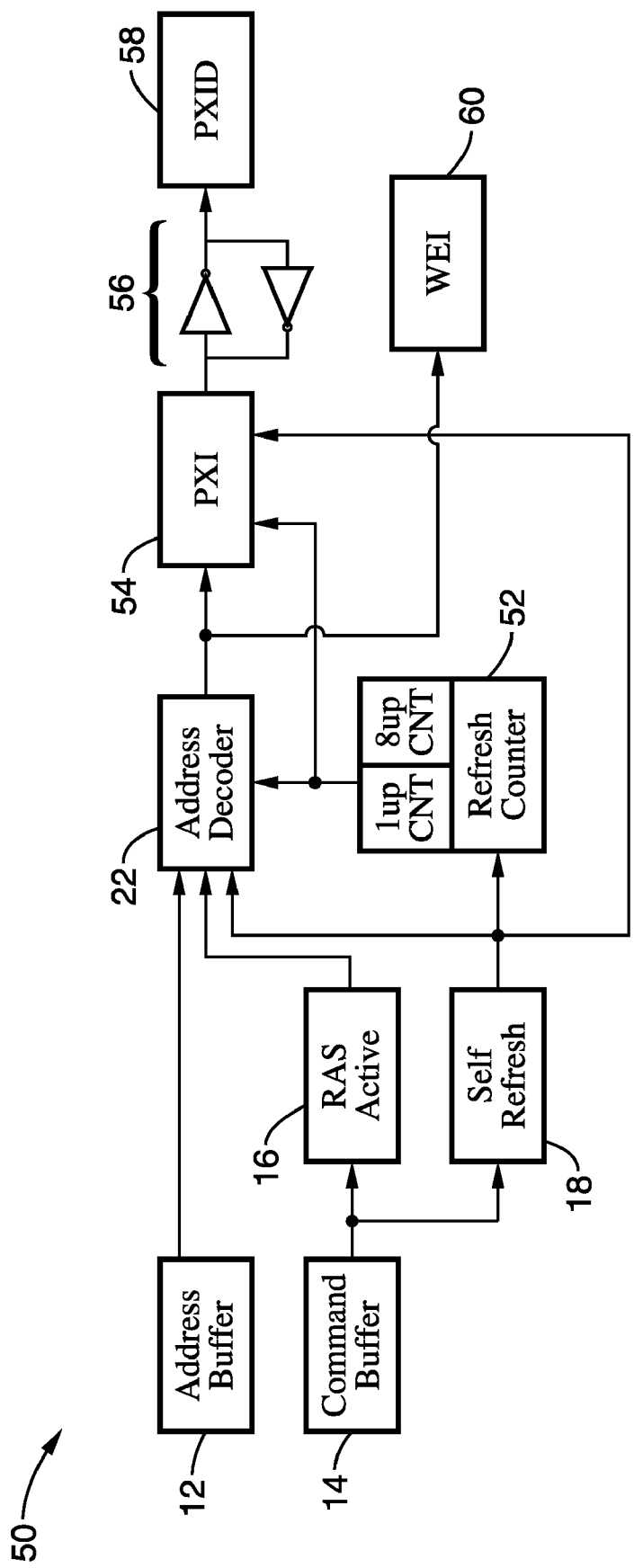
FIG. 10 is a block diagram of PXID generation according to an aspect of the present invention.

FIG. 10 is a block diagram of a first embodiment 50 of a PXID and WEI generation apparatus according to an aspect of the present invention. This embodiment provides the flexibility to control timing and sequence of PXID differently between normal operation and self-refresh operation. As shown in FIG. 10 the output of address buffer 12 is directed to address decoder 22. Output from command buffer 14 is directed to row address selection (RAS) 16 and self refresh control 18 whose output is received by a refresh counter 52. It is preferable that the refresh counter incorporates multiple counters, the example is shown incorporating both 1up and 8up counters. It will be noted that the 1up counter provides for normal operations (random accesses) while the use of the 8up counter allows the number of output transitions to be reduced during self-refresh. It should be appreciated that the 8up counter may alternatively span more or less counts depending on application (e.g., 4up, 16up, and so forth). It should also be noted that the counters may be modulo selectable in response to self-refresh control signals. The output from RAS 16, self-refresh 18, and refresh counter 52 are directed with the address buffer 12 to an address decoder 22. Output from address decoder 22 is directed to a PXI circuit 54 which is latched 56 for outputting PXID 58. The latch is coupled on the output of PXI to prevent transitions with respect to WEI, in view of the counter input to PXI. It will be noted that PXI circuit 54 also receives input from both the self-refresh circuit 18 and refresh counter 52. Output from the address decoder is directed at a WEI circuit 60. In this embodiment, the timing and sequence of PXID can be established as desired, and can provide separate timing than the separate generation of WEI circuit 60.

It should be noted that although 1up and 8up counters are shown as preferred embodiments, the number of counters and values associated with each counter may change to accommodate different levels of complexity, density and/or configuration. It will also be appreciated that a single counter can be utilized whose operation changes during self-refresh mode in response to signal input. It should be appreciated that in normal modes the sequence of data access is typically random, wherein the 1up counter does not agglomerate output transitions to reduce their number. However, in self-refresh mode the access pattern is preferably predictable, wherein line transitions can be reduced according to the invention with respect to PXID, WEI and/or ISO. It will be noted that an 8up counter preferably spans 3 bits of counting (e.g., pick up the $3^{rd}$ least-significant bit (LSBit)) which allows sequencing across a group of 8 lines, thus controlling 256 addresses. It will also be noted that the count may agglomerate more or less transitions as desired, such as by changing the size of the counter (e.g., 4up, 12up, 16up, 32up, and so forth).

Figure 11:
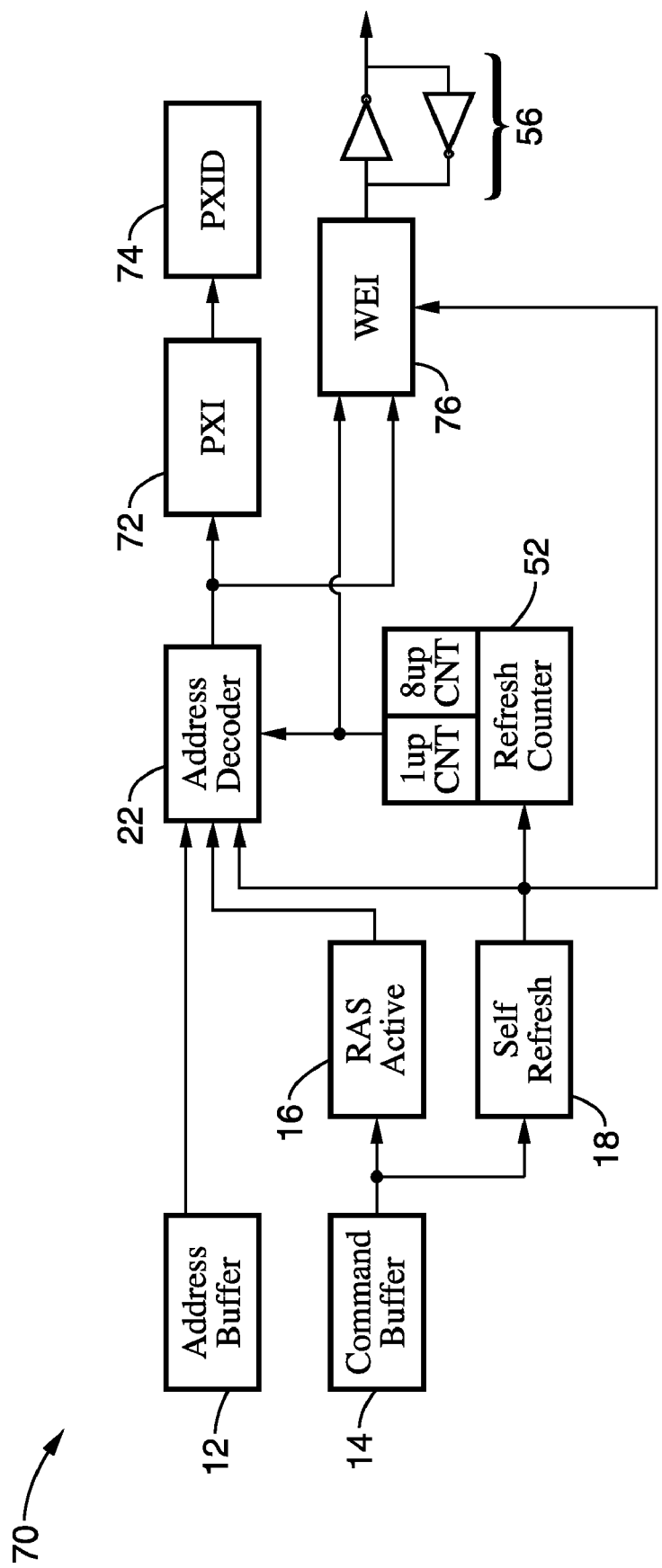
FIG. 11 is a block diagram of WEI generation according to an aspect of the present invention.

FIG. 11 is a block diagram of a second embodiment 70 of a PXID and WEI generation apparatus according to an aspect of the present invention. This second embodiment provides the flexibility to control the timing and sequence of WEI differently between normal operation and self-refresh operation.

As shown in the figure, the output of address buffer 12 is directed to address decoder 22. Output from command buffer 14 is directed to row address selection (RAS) 16 and self refresh control 18 whose output is received by a refresh counter 52. This embodiment of refresh counter is also shown incorporating both 1up and 8up counters, although other counter configurations can be utilized such as previously described. The output from RAS 16, self-refresh 18, and refresh counter 52 are directed with the address buffer 12 to an address decoder 22. Output from address decoder 22 is directed to a PXI circuit 72 and driver output PXID 74. Output from the address decoder is also directed at a WEI circuit 76 output through latch 56. The latch is coupled on the output of WEI to prevent transitions with respect to PXID, in view of the counter input to WEI. It will be noted that WEI circuit 76 also receives input from both the self-refresh circuit 18 and refresh counter 52. In this embodiment, the timing and sequence of WEI can be established as desired, and can provide separate timing than provided by the separate WEI generation circuit 60, allowing different timing to be employed. It should be appreciated that these embodiments are shown by way of example, wherein one of ordinary skill in the art can implement a number of similar circuits without departing from the teachings of the present invention.

Figure 12A:
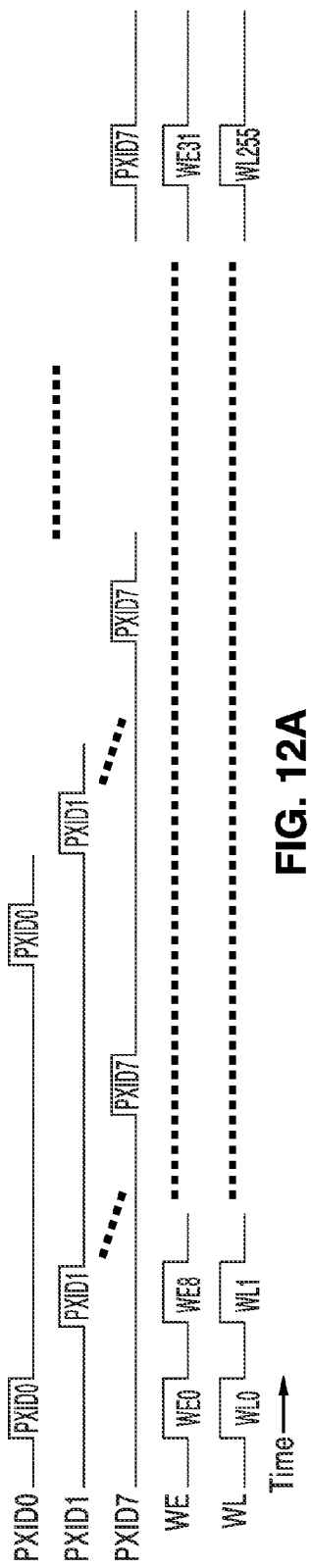
FIG. 12A through 12C are timing diagrams of PXID and WE control timing according to an aspect of the present invention.
Figure 12B:
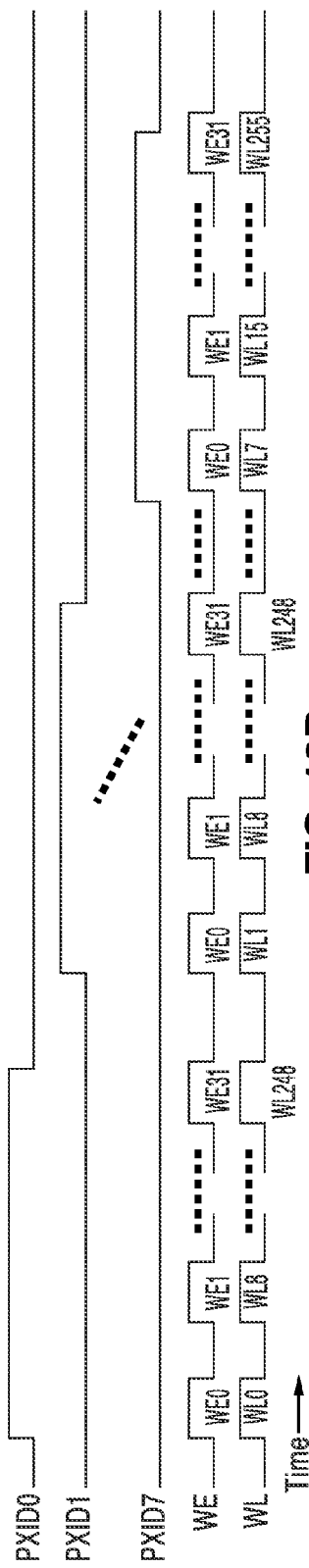
Figure 12C:
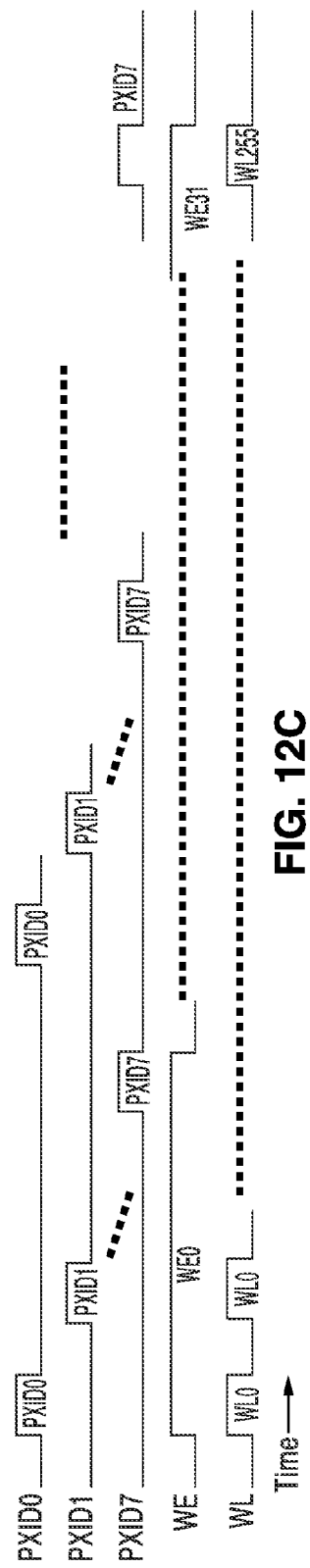

FIG. 12A through 12C are timing diagrams showing PXID and WE control in normal and auto refresh modes in FIG. 12A, type 1 self-refresh in FIG. 12B, and type 2 self-refresh in FIG. 12C. In FIG. 12A it will be seen that the PXID and WE lines are subject to 256 activations for each block refresh when in normal or auto-refresh modes as in the conventional circuits. In FIG. 12B a first type of timing configuration is shown. It will be appreciated that the use of multiple counters, as shown in FIG. 10 and FIG. 11, for use with the PXID, WEI circuits allows a number of types of timing and sequencing to be established. In the timing sequence of FIG. 12B, the word line (WL) output is modified from the conventional scheme such that multiple PXID signals are combined so that the number of PXID signal generations can be reduced during a special operating mode, such as self-refresh mode. For example, the activation sequence as shown in FIG. 12B enables word lines in an activation sequence of WL0, WL8, WL16 ... WL248, WL1, WL9, WL17 ... WL249 ... WL7, WL15, WL23 ... WL255, wherein PXID is common among each sub-sequence of activated word lines. Since one PXID signal is generated and held for the self-refresh of 32 word lines, current consumption for PXID signals can be reduced by a factor of 32 in the timing diagram shown in FIG. 12B.

In FIG. 12C, a similar control scheme can be applied to word enable, WE (or WEI) signals, wherein word enable signals are combined such that the number of WE signals generated is reduced during special operating modes, such as self-refresh mode. According to this method, the activation sequence of the word lines is unchanged from that of conventional self-refresh control schemes, however, WE signals are generated and held while PXID is stepped through from PXID0 to PXID7. Since only one WE signal is generated and held through multiple PXID signals, current consumption for WE signals can be reduced by a factor of eight in the timing diagram shown in FIG. 12C.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A memory circuit for dynamic memories having self-refresh capability, comprising:
    address and command buffers configured for receiving address and command information for controlling memory operations;
    a row activation selection (RAS) circuit coupled to said command buffer;
    a self-refresh circuit coupled to said command buffer;
    at least one refresh counter coupled to said self-refresh circuit;
    an address decoder configured for receiving the output from said address buffer, RAS circuit, self-refresh circuit and refresh counter;
    a block selection circuit coupled to said address decoder and configured for driving bit line equalization (BLEQ) circuits and sense amplifier enable (SAPN) circuits;
    a circuit for generating isolator control signals (ISO), pre-decoded row address drivers (PXID) and plural word enable (WE) lines selected from one or more of the following,
    (i) a block iso-selection circuit configured for driving an ISO generation circuit adapted for generating isolator control signals,
    said block iso-selection circuit configured with separate sequencing and/or timing, than said block selection circuit, in response to self-refresh mode operations of the memory circuit, wherein said block iso-selection circuit can selectively output fewer ISO signal transitions during self-refresh mode operations of the memory circuit than when in normal operating modes,
    (ii) a pre-decoded row address driver (PXID) circuit coupled to said self-refresh circuit and to a counter of said at least one refresh counter, in addition to being coupled to said address decoder;
    said PXID circuit configured with separate sequencing and/or timing than if coupled only to said address decoder, wherein said PXID circuit can selectively output fewer PXID signal transitions during self-refresh mode operations of the memory circuit than when in normal operating modes,
    (iii) a word enable (WE) circuit coupled to said self-refresh circuit and to a counter of said at least one refresh counter, in addition to being coupled to said address decoder, and
    said WE circuit configured with separate sequencing and/or timing than if it were only coupled to said address decoder, wherein said WE circuit can selectively output fewer WE signal transitions during self-refresh mode operations of the memory circuit than when in normal operating modes.

2. A memory circuit as recited in claim 1, wherein said block ISO selection circuit is coupled to said address decoder, said self-refresh circuit, and said refresh counter.

3. A memory circuit as recited in claim 1, wherein said block ISO selection circuit generates isolator control signals similar to that of a conventional ISO generation circuit coupled to the same block selection circuit to which the bit line equalization (BLEQ) circuits and sense amplifier enable signals (SAPN) are coupled.

4. A memory circuit for dynamic memories as recited in claim 1, wherein said separate timing and sequencing of ISO, PXID and/or WE reduce average voltage swing of control signals.

5. A memory circuit for dynamic memories as recited in claim 1,
    wherein timing and sequencing of said isolator control signals (ISO) can be changed independently of bit line equalization (BLEQ) and sense amplifier enable (SAPN) circuits in response to self-refresh mode.

6. A memory circuit for dynamic memories as recited in claim 1, wherein said isolator control signals (ISO), pre-decoded row address (PXID) drivers and/or word enable (WE) signals are configured for controlling PXID signal generation from a PXID generation circuit which receives self-refresh, refresh counter, and address decoder signals for establishing separate timing and sequencing than the WE signals when the memory device is in a self-refresh mode.

7. A memory circuit for dynamic memories as recited in claim 1, wherein said isolator control signals (ISO), pre-decoded row address (PXID) drivers and/or word enable (WE) signals are configured for controlling WE signal generation from a WE generation circuit which receives self-refresh, refresh counter, and address decoder signals for establishing a separate timing and sequencing than the PXID signals when the memory device is in a self-refresh mode.

* * * * *